United States Patent [19]

Nishino et al.

[11] Patent Number: 4,965,229
[45] Date of Patent: Oct. 23, 1990

[54] GLASS CERAMIC FOR COATING METAL SUBSTRATE

[75] Inventors: Atsushi Nishino, Neyagawa; Yasuo Mizuno, Hirakata; Masaki Ikeda, Hirakata; Masahiro Hiraka, Hirakata, all of Japan

[73] Assignee: Matsushita Electric Industrial Co., Ltd., Japan

[21] Appl. No.: 304,476

[22] Filed: Feb. 1, 1989

[30] Foreign Application Priority Data

Feb. 5, 1988 [JP] Japan .................................. 63-26131
Feb. 5, 1988 [JP] Japan .................................. 63-26132

[51] Int. Cl.$^5$ .............................................. C03C 8/00
[52] U.S. Cl. ...................................... 501/14; 501/78; 501/77
[58] Field of Search ................ 501/14, 18, 21, 24, 501/77, 78

[56] References Cited

U.S. PATENT DOCUMENTS 3,493,404  2/1970  Earl ......................................... 106/48
3,964,918  6/1976  Hares et al. ............................ 106/47
4,256,796  3/1981  Hang et al. ............................ 428/210
4,343,908  8/1982  Faulstich et al. ...................... 501/78
4,385,127  5/1983  Chyung .................................... 501/5
4,557,862  8/1985  Francel et al. ......................... 501/14
4,742,028  3/1988  Boudot et al. ......................... 501/78

FOREIGN PATENT DOCUMENTS 56-73643   6/1981  Japan .
2158062   11/1985  United Kingdom .

OTHER PUBLICATIONS

European Search Report, 04-28-89, The Hague.
Chemical Abstracts, Apr. 1986, vol. 104, #14 p. 309.

Primary Examiner—William R. Dixon, Jr.
Assistant Examiner—Chris Gallo
Attorney, Agent, or Firm—Stevens, Davis, Miller & Mosher

[57] ABSTRACT

The present invention relates to a glass ceramic which can provide a board comprising a metal substrate and the glass ceramic coated on said substrate, particularly a board comprising said board and a fine wiring pattern applied onto said board by means of thick film printing. In particular, it specifies the composition of the glass ceramic.

3 Claims, 3 Drawing Sheets

GLASS CERAMIC FOR COATING METAL SUBSTRATE

BACKGROUND OF THE INVENTION

1. Field of the Invention

The present invention relates to a glass ceramic which can provide a board comprising a metal substrate and the glass ceramic coated on said substrate, particularly a board comprising said board and a fine wiring pattern applied onto said board by means of thick fill printing.

2. Discussion on Related Art

Thick film hybrid ICs and, printed circuit boards have hitherto been prepared by using alumina boards or epoxy resin-glass boards. The Alumina boards have a defect of poor mechanical strength and of difficulty in producing large-sized boards. Epoxy resin-glass boards, on the other hand, are inexpensive and suited for large scale production but are unsatisfactory in thermal resistance, so that they have disadvantages in that the materials which can be used for circuit formation in said boards are limited to those for low temperature use (whereas the majority of thick film pastes require a firing temperature of 800° to 900° C.) and that the resulting products can be used only in an atmosphere of lower than 400° C.

In order to obviate the disadvantages of the above-mentioned boards of the prior art, so-called porcelain enamel insulated boards formed by coating a glassy material on metal substrates have been proposed. One of the proposals relates to a board in which the porcelain enamel insulating layer comprises an amorphous glass containing a relatively small amount of alkali metal oxides ($Na_2O$, $K_2O$ and $Li_2O$). The insulated boards of this type, however, have problems in re-softening, electric insulation and reliability of the insulating layer and in the accuracy of the circuit. In more particular, said boards have the following disadvantages: (1) when the porcelain enamel insulating layer is repeatedly fired, the insulating enamel layer will re-soften; (2) they are poor in electric insulation at high temperature as compared with prior boards (namely alumina boards); (3) when voltage is applied to the board at high temperature for long time, the circuit network is adversely affected owing to the migration of alkali ions; (4) the printed circuit undergoes contraction during the firing of the paste owing to the cohesive force of the paste in firing.

Another proposal relates to an attempt to use a crystallized glass for the porcelain enamel insulating layer. For example, as disclosed in U.S. Pat. No. 4,256,796, a porcelain enamel insulated board formed by coating on a steel plate a crystallized glass having the composition of 6–25% by mole of BaO, 30–60% by mole of a metal oxide (selected from the group consisting of MgO, ZnO and CaO, or a mixture of two or more thereof), 13–35% by mole of $B_2O_3$ and 10–25% by mole of $SiO_2$ undergoes no re-softening of the porcelain enamel layer even when printed with paste at 800° to 900° C. and subjected to repeated firing and moreover, since the glass is alkali-free, is excellent in electric insulation and reliability. Thus, the boards of the second proposal wholly excel those of the first proposal.

Though the composition is expressed in terms of % by mole in said U.S. Pat. No. 4,256,796, it roughly becomes as follows when calculated in terms of % by weight with reference to working examples disclosed in Japanese Patent Application corresponding to said U.S. Patent [namely, Japanese Patent Application Kokai (Laid-Open) No. 56-73643].

| | |
|---|---|
| BaO | 16–50% by weight |
| MgO | 16–42% by weight |
| CaO | 0–11% by weight |
| ZnO | 0–11% by weight |
| CaO + ZnO | 0–11% by weight |
| $B_2O_3$ | 12–34% by weight |
| $SiO_2$ | 10–23% by weight |
| $ZrO_2$ | 0–5% by weight |
| $Al_2O_3$ | 0–5% by weight |
| $SnO_2$ | 0–5% by weight |
| $ZrO_2$ + $Al_2O_3$ + $SnO_2$ | 0–5% by weight |

However, the boards according to the second proposal have the following defects: (1) a poor thermal resistance; (2) a poor chemical resistance; (3) a large surface roughness, which makes the board unsuitable as a board for fine pattern wiring.

With regard to the defects (1) and (2) mentioned above, attempts have been made to ameliorate the defects by varying the composition of the glass, as disclosed in Japanese Patent Application Kokai (Laid-Open) Nos. 58-104042 and 60-172102, but they have not yet been put to practical use. This is because the boards obtained in above attempts have an extremely increased surface roughness as compared with those of the second proposals and hence cannot be used as a circuit board for thick film printing. Glass ceramics of MgO—BaO—$SiO_2$—$B_2O_3$ type tend to undergo precipitation of the crystal phases of BaO·2MgO·2$SiO_2$ and 2MgO·$B_2O_3$ when fired at 800° to 900° C. and, in certain range of compositions, the ceramics undergo an extreme growth of crystal grains or precipitation of unusually large amount of crystals. These phenomena exert a great influence on the surface roughness of porcelain enamel insulated boards.

Thus, the most serious defect of the prior art glass ceramics is that, as shown in FIG. 2, the crystal grains increase their size during firing and, as a consequence, the surface roughness increases extremely.

In recent years, with the trend towards ICs of higher density and the advance in packaging technology, the requirements in circuit formation on boards have been increasingly directed toward higher density, higher integration and finer pattern.

In thermal heads, for example, a high density and a fine pattern of an electrode width of 30 μm or less and an electrode interval of 200 μm or less are required. Such requirements cannot be fulfilled by previous glass ceramics because of their too high surface roughness and have been coped with by lap-polishing the board. Such a means has been unable to satisfy the need for cost reduction, which is one of the advantageous features of porcelain enamel boards.

SUMMARY OF THE INVENTION

The present invention relates to a glass ceramic material which can provide a porcelain enamel insulated board excellent in thermal resistance, chemical resistance and surface smoothness, which were described above as the problems in prior art boards.

The glass ceramic for coating metal substrates according to the present invention comprises 8–20% by weight of $SiO_2$, 10–30% by weight of $B_2O_3$, 20–50% by weight of MgO, 1–20% by weight of CaO, 3–40% by weight of $La_2O_3$ or $CeO_2$, 0–15% by weight of BaO, 0–5% by weight of $MO_2$ (wherein M is at least one metal selected from Zr, Ti and Sn) and 0–5% by weight of $P_2O_5$.

The glass ceramic having the composition in the above-stated range is, as compared with previous glass ceramics, not only improved in thermal resistance, water resistance and said durability but markedly improved in surface smoothness as shown in FIG. 1, and can be used to give a board capable of forming a high-density, fine pattern.

DETAILED DESCRIPTION OF PREFERRED EMBODIMENTS

Figure 1:
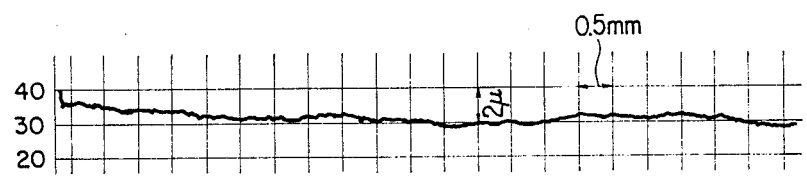
FIG. 1 is a chart showing the results of determination of the surface roughness of a glass ceramic of one embodiment of the present invention.
Figure 2:
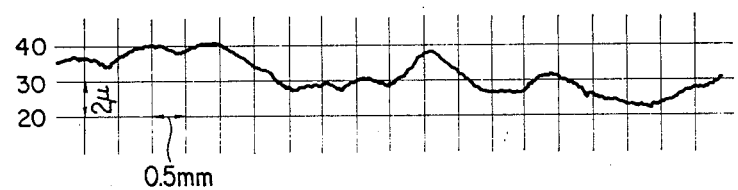
FIG. 2 is a chart showing the results of determination of the surface roughness of a glass ceramic of the prior art.

Before describing the working examples of the present invention in detail, the respective process steps used in the invention will be briefly described.

(1) Step of mixing the raw materials of glass $MgCO_3$, $BaCO_3$, $CeO_2$, $La_2O_3$, $SiO_2$, $H_3BO_3$, $CaCO_3$ and optionally other materials are weighed and thoroughly mixed by means of a blender so as to give an intended composition. Since $MgCO_3$ has a very high bulk density, it is more favorable to feed the material in the form of pellets obtained by adding a suitable amount of water thereto and pelletizing the mixture with a pelletizer or the like than feeding the material in the form of powder, from the viewpoint of the homogeneity of the resulting glass and the stability of melting conditions.

(2) Step of melting glass

Since the glass of the present invention basically contains no alkaline constituent, it has a higher melting temperature than that of ordinary glass and is molten at 1400° to 1500° C. Therefore, platinum crucibles are usually used for melting, but zircon or graphite crucibles may also be used. In large scale production, continuous melting furnaces are preferably used instead of crucibles.

Though the glass melt molten in a crucible may be cooled either by quenching in water or by quenching with a water-cooled roller, the latter quenching is preferable from the viewpoint of the stability of glass.

(3) Kind of metal substrate and pretreatment step thereof

The metal substrates used in the present invention include steel plaster porcelain enamel ware, stainless steel plates, plates of various alloys such as nickel-chromium-iron, nickel-iron, coval and invar, Cu-clad steel plates, and the like.

To improve the adhesion of the above-mentioned metal substrate with glass ceramic, the substrate is subjected, before use, to surface degreasing and then to plating with various metals such as nickel, cobalt and chromium or to thermal oxidation thereby to form an oxide film thereon.

(4) Step of coating glass ceramic

The means for coating the glass obtained in step (2) on the metal substrate described in (3) include conventional spraying, electrostatic powder coating and electrophoretic deposition. From the viewpoint of the denseness of coated film, the electrophoretic deposition is most preferable.

Glass, alcohol and a small amount of water are placed in a ball mill, and mixed and ground therein for about 20 hours to give an average glass particle diameter of about 1–5 $\mu$m. The slurry thus obtained is placed in an electrolytic cell and the slurry is circulated. The metal substrate prepared in step (3) is immersed in the slurry and subjected to cathodic polarization at a voltage of 100–400 V, thereby glass particles are deposited on the metal substrate surface. The metal substrate is dried and then fired at 850°–900° C. for about 10–30 minutes. Through these steps, the coating of glass ceramic is formed on the metal substrate.

EXAMPLE

The present invention will be illustrated more concretely below with reference to Examples.

Table 1 shows the results of evaluating various characteristic properties of the samples including surface roughness, waviness, thermal resistance, acid durability, and printing accuracy which samples were obtained by melting the glass ceramics of the present invention and of Comparative Examples and then, in accordance with the steps stated above, electrophoretically depositing a glass ceramic layer of 100 $\mu$m thickness onto the surface of a SUS 430 substrate (50 mm×50 mm×0.8 mm in dimension) followed by firing at 900° C. for 10 minutes. Table 3 shows the results of examination of the above-mentioned characteristic properties for Examples of the present invention.

The surface roughness was measured by use of a Tarisurf surface roughness meter and expressed in terms of center line average roughness Ra. The waviness was expressed in terms of the difference $R_{max}$ between the crest and the trough obtained with the Tarisurf surface roughness meter.

The thermal resistance was examined by subjecting a sample to a spalling test, which comprises repeating a cycle consisting of placing the sample in an electric furnace at 920° C. for 10 minutes, withdrawing it from the furnace and then allowing it to cool for 30 minutes, and then examining any cracks and peeling of the glass ceramic layer which had developed in the sample. The presence of cracks was examined by visual observation after immersing the sample in red ink and then wiping the in1: away from the surface.

The symbols , Δ and X in the Table have the following meaning: : no crack or peeling develops even after 10 cycles or more; Δ: cracks or peeling develops after 5–9 cycles; X: cracks or peeling develops in 4 cycles or less.

The acid durability was evaluated in terms of the weight decrease of a porcelain enamel layer determined after immersing the sample in 5% citric acid solution at 60° C. for 30 minutes. The symbol a weight decrease of 10 mg/cm² or less, A 11–20 mg/cm² and X 20 mg/cm² or more.

For evaluation of the printing accuracy, gold electrodes of 30 $\mu$m width were formed in a staggered arrangement on a sample at a rate of 6 electrodes/mm and then ruthenium oxide resistors of 300 μm width were further formed thereon, after which the resistance between the electrodes was determined. The symbol means that the variation of the resistance between electrodes thus determined was 10% or less, Δ 10–20%, and X 20% or more. Overall evaluation was made based on the above evaluations and the results were expressed by symbols , , Δ and X, they denote: excellent, good, fair, and poor respectively.

In Table 1, Nos. 1 to 7 indicant the samples in which the content of $SiO_2$ and $B_2O_3$ were varied and the content of other constituents were kept constant; Nos. 8 to 13 those in which the ratio $SiO_2/B_2O_3$ was kept approximately constant while the MgO content was varied; Nos. 14 to 18 those similar to above except that the CaO content was varied; Nos. 19 to 24 those similar to above except that the $La_2O_3$ content was varied; Nos. 25 and 26 those in which BaO content was varied; and Nos. 27 to 32 those for showing the effect of addition of $ZrO_2$, $TiO_2$, $SnO_2$, $Al_2O_3$ or $P_2O_5$. Nos. 33, 34 and 35, which are shown as Comparative Examples, respectively indicate those disclosed in Japanese Patent Application Kokai (Laid-Open) Nos. 56-73643, 58-104042 and 60-172102.

As is apparent from Table 1, with an increase in $SiO_2$ content, the thermal resistance and acid durability are improved but the surface smoothness is deteriorated, and hence the coating becomes unsuitable for fine pattern printing. In contrast, as the $B_2O_3$ content is increased, the acid durability and thermal resistance are deteriorated though the surface smoothness is certainly improved.

Accordingly, although $SiO_2$ is used in the range of 8 to 20% by weight and $B_2O_3$ in the range of 10 to 30% by weight in the present invention, a more preferable range is 10 to 20% by weight for $SiO_2$, 15 to 25% by weight for $B_2O_3$, and 0.25 to 1.0 for the ratio $SiO_2/B_2O_3$.

The MgO content shows a correlation with crystallinity. When it is 20% by weight or less, the deposition of crystals is insufficient and thermal resistance is poor. When it is 50% by weight or more, crystal deposition is liable to occur and the glass readily undergoes crystallization even during melting; consequently homogeneous glass is difficultly obtained and, at the same time, the surface roughness is increased and the printing characteristic for fine pattern is deteriorated. Accordingly, the content of MgO is more preferably 20 to 40% by weight.

CaO has a function of improving the acid resistance of the glass and of improving the surface smoothness of the board.

Figure 3:
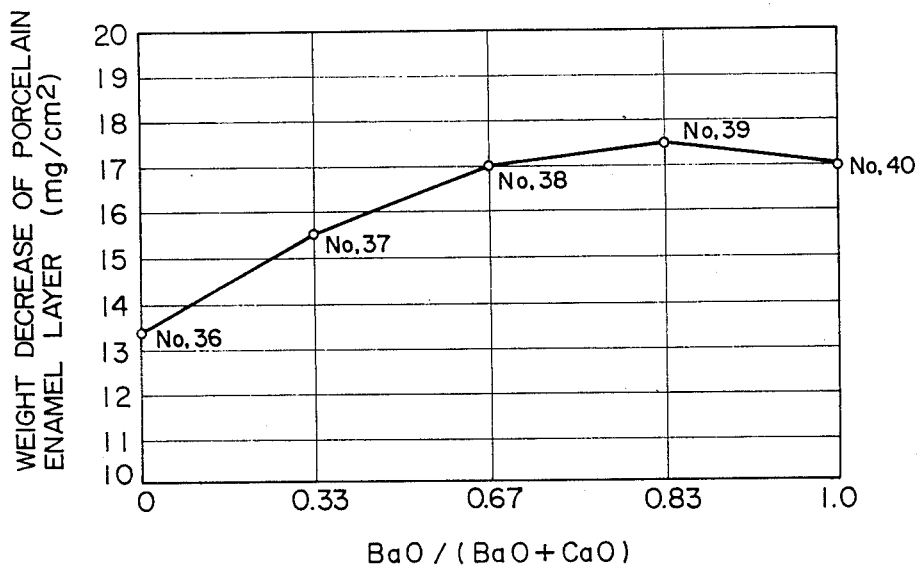
FIGS. 3, 4 and 5 are each a chart showing, for a glass ceramic of one embodiment of the present invention, the results of acid durability test to citric acid, the results of acid durability test to aqua regia and the results of evaluation of the surface smoothness, respectively.
Figure 4:
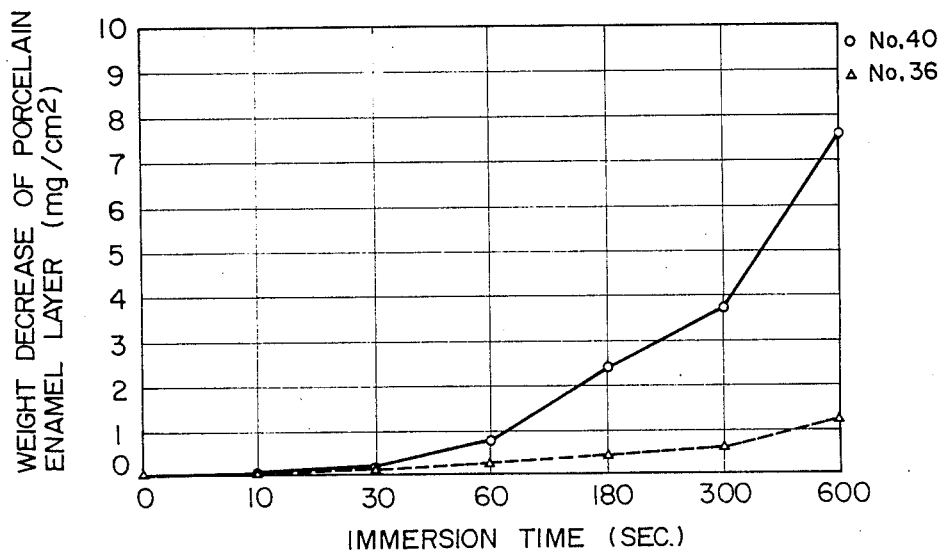

FIG. 3 shows the results of evaluating the above-stated acid durability to citric acid of boards using a series of glass wherein the ratio of BaO to (BaO+CaO) contained in the glass were varied (the compositions being shown in Nos. 36 to 40 of Table 2). As the ratio BaO/(BaO+CaO) is decreased, the weight decrease becomes smaller, which means a more excellent acid durability. FIG. 4 shows the results of examination of weight decrease of a board using the glass of No. 36 or No. 40 after immersion in 5% aqua regia at room temperature. No. 36 shows a smaller weight decrease, which means it is more excellent in acid durability. These results reveal that CaO has a function of improving the acid durability of glass, whereas BaO has no such function.

Figure 5:
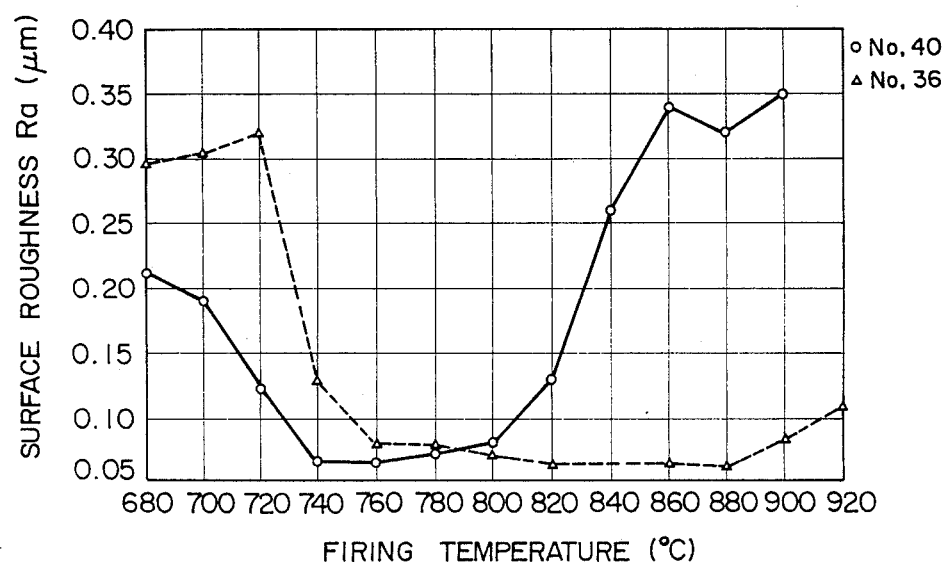

FIG. 5 shows the results of examining the relation between the firing temperature and the center line average roughness Ra, taken as the measure of surface smoothness, for a board using the glass of No. 36 or No. 40. In No. 40, Ra becomes extremely large when firing is conducted at 820° C. or above. Since the majority of thick film pastes available in the market require a firing temperature of 810° to 850° C., the firing temperature of boards should generally be higher than the above range. For example, when the board is fired at 900° C., Ra reaches 0.35 μm and when thick film paste is printed thereon to a thickness of 0.3 μm, the disconnection of circuit will occur. In No. 36, on the other hand, Ra is only 0.08 μm even when the board is fired at 900° C., and scarcely any disconnection of circuit will occur even when thick film paste is printed thereon. This is because in the glass of No. 40 two kinds of crystals, namely $2MgO \cdot B_2O_3$ and $BaO \cdot 2MgO \cdot 2SiO_2$, are formed, causing the increase of Ra, whereas in the glass of No. 36 only the crystals of $2MgO \cdot B$ are formed since the glass contains no BaO, and hence no such increase in Ra occurs.

Thus, CaO has a function of improving the acid resistance of the glass and of improving the surface smoothness of the board. Therefore, it is preferably contained in a proportion of at least 1% by weight. However, a content exceeding 20% by weight is undesirable because it results in a poor thermal resistance and poor printing characteristics.

$La_2O_3$ improves the surface smoothness of the board and greatly contributes to the improvement of thermal resistance. The improvement of thermal resistance presumably caused by the improvement of adhesion of the substrate with the porcelain enamel layer. When tested according to the PEI test method developed by American Porcelain Enamel Institute with nickel-treated SUS 430 used as the substrate, the adhesion of a board using No. 41 glass containing no $La_2O_3$ was 26%, while that of a board using No. 36 glass containing $La_2O_3$ was 100%. The reason for improvement in adhesion of the substrate with the porcelain enamel layer is not clear, but presumably attributable to the mutual reaction between $La_2O_3$ and $Fe_2O_3$ as well as NiO contained in the substrate. It is described in Binary Phase Diagrames Handbook, 3/81 (1981, GE Co.) that La forms compounds with Fe and Ni, although this does not straightly support the above presumption. For the above reason, the content of $La_2O_3$ is preferably at least 3% by weight. However, a content exceeding 40% by weight is undesirable because it results in deterioration of acid durability. Moreover, $La_2O_3$ is expensive and too large a content thereof leads to an increase in cost of the glass ceramic. Accordingly, the content is more preferably in the range of 3 to 30% by weight.

Exactly similar results to those described above are obtained when $La_2O_3$ was replaced by $CeO_2$ in Table 3. Thus, $CeO_2$ functions in the same manner as $La_2O_3$.

Although BaO is not an indispensable constituent in the present invention, it may be added within limits not exceeding 15% by weight. This is because, as stated above, it lowers the acid durability and surface smoothness.

Although $MO_2$ contributes to improving the acid durability, a content higher than 5% by weight is undesirable because it increases the surface roughness.

Among the group of $MO_2$, the degree of improvement of acid durability increases in the order of $SnO_2$, $TiO_2$, $ZrO_2$. Accordingly, $ZrO_2$ is most preferably used.

$P_2O_5$ contributes to the crystallization of the glass ceramic material, but a content higher than 5% by weight is undesirable because it causes an increase in surface roughness.

Besides the constituents described above, other oxides may be added to the material to change the thermal expansion coefficient or to color the material. These oxides include alkali metal oxides and the oxide of iron, manganese, nickel, cobalt, vanadium, lead, molybdenum, tungsten, bismuth, cadmium, strontium and aluminum. However, the content of alkali metal oxides is desirably 2% by weight or less in consideration of electric insulating characteristic, and the content of the other oxides is desirably 5% by weight or less.

Other components than those described in the present Example may also be contained in the glass within a range that can be regarded as impurities.

As set forth above, the glass ceramic of the present invention provides a coating layer which is more excellent in surface smoothness, acid durability, thermal resistance, and processing accuracy in fine pattern printing than the prior art coating. Though the present specification was mainly described with boards for electric circuit as its possible application, the present glass ceramic can also be used for machine parts which require good surface smoothness, e.g. thrust bearings and mechanical seals, or articles that require good thermal resistance or chemical durability, which include automobile parts such as engine covers, household appliances such as enameled pots, and chemical apparatuses such as pipings and tanks.

TABLE 1

| | | No. 1 | 2 | 3 | 4 | 5 | 6 | 7 | 8 | 9 | 10 | 11 | 12 |
|---|---|---|---|---|---|---|---|---|---|---|---|---|---|
| Composition (wt %) | $La_2O_3$ | 5 | 5 | 5 | 5 | 5 | 5 | 5 | 5 | 5 | 5 | 5 | 5 |
| | MgO | 39 | 39 | 39 | 39 | 39 | 39 | 39 | 15 | 20 | 30 | 40 | 50 |
| | CaO | 3 | 3 | 3 | 3 | 3 | 3 | 3 | 3 | 3 | 3 | 3 | 3 |
| | BaO | 12 | 12 | 12 | 12 | 12 | 12 | 12 | 10 | 10 | 10 | 10 | 10 |
| | $B_2O_3$ | 10 | 15 | 19 | 25 | 28 | 30 | 33 | 42 | 39 | 32 | 26 | 19 |
| | $SiO_2$ | 28 | 23 | 19 | 13 | 10 | 8 | 5 | 22 | 20 | 17 | 13 | 10 |
| | $ZrO_2$ | 2 | 2 | 2 | 2 | 2 | 2 | 2 | 2 | 2 | 2 | 2 | 2 |
| | $TiO_2$ | — | — | — | — | — | — | — | — | — | — | — | — |
| | $SnO_2$ | — | — | — | — | — | — | — | — | — | — | — | — |
| | $P_2O_5$ | 1 | 1 | 1 | 1 | 1 | 1 | 1 | 1 | 1 | 1 | 1 | 1 |
| | $Al_2O_3$ | — | — | — | — | — | — | — | — | — | — | — | — |
| $SiO_2/B_2O_3$ | | 2.8 | 1.53 | 1.0 | 0.52 | 0.36 | 0.27 | 0.15 | 0.52 | 0.51 | 0.53 | 0.5 | 0.53 |
| Surface roughness (μm) | | 0.46 | 0.38 | 0.11 | 0.05 | 0.07 | 0.06 | 0.08 | 0.08 | 0.08 | 0.05 | 0.07 | 0.10 |
| Waviness (μm) | | 3.2 | 2.5 | 0.7 | 0.5 | 0.7 | 1.0 | 0.9 | 1.1 | 1.1 | 0.9 | 0.5 | 1.4 |
| Thermal resistance | | O | O | O | O | O | O | Δ | X | Δ | O | O | O |
| Acid durability | | O | O | O | O | O | O | X | | O | O | O | O |
| Printing accuracy | | X | X | O | O | O | Δ | Δ | X | O | O | O | Δ |
| Overall judgement | | X | X | ⊙ | ⊙ | O | X | X | X | O | ⊙ | ⊙ | Δ |

| | | No. 13 | 14 | 15 | 16 | 17 | 18 | 19 | 20 | 21 | 22 | 23 |
|---|---|---|---|---|---|---|---|---|---|---|---|---|
| Composition (wt %) | $La_2O_3$ | 5 | 5 | 5 | 5 | 5 | 5 | 2 | 3 | 10 | 30 | 40 |
| | MgO | 55 | 40 | 40 | 40 | 40 | 40 | 25 | 25 | 25 | 25 | 20 |
| | CaO | 3 | — | 1 | 10 | 20 | 25 | 3 | 3 | 3 | 3 | 3 |
| | BaO | 10 | 5 | 5 | 5 | 5 | 5 | — | — | — | — | — |
| | $B_2O_3$ | 16 | 31 | 30 | 25 | 18 | 15 | 45 | 44 | 40 | 27 | 23 |
| | $SiO_2$ | 8 | 16 | 16 | 12 | 9 | 7 | 23 | 23 | 20 | 13 | 12 |
| | $ZrO_2$ | 2 | 2 | 2 | 2 | 2 | 2 | 2 | 2 | 2 | 2 | 2 |
| | $TiO_2$ | — | — | — | — | — | — | — | — | — | — | — |
| | $SnO_2$ | — | — | — | — | — | — | — | — | — | — | — |
| | $P_2O_5$ | 1 | 1 | 1 | 1 | 1 | 1 | — | — | — | — | — |
| | $Al_2O_3$ | — | — | — | — | — | — | — | — | — | — | — |
| $SiO_2/B_2O_3$ | | 0.5 | 0.52 | 0.53 | 0.48 | 0.5 | 0.47 | 0.51 | 0.52 | 0.5 | 0.48 | 0.52 |
| Surface roughness (μm) | | 0.18 | 0.08 | 0.07 | 0.05 | 0.09 | 0.14 | 0.21 | 0.10 | 0.09 | 0.09 | 0.10 |
| Waviness (μm) | | 1.5 | 0.7 | 0.7 | 0.6 | 0.9 | 1.5 | 1.8 | 1.0 | 0.8 | 0.9 | 1.0 |
| Thermal resistance | | O | Δ | O | O | O | Δ | Δ | O | O | O | O |
| Acid durability | | O | O | O | O | O | Δ | O | O | O | O | Δ |
| Printing accuracy | | X | Δ | Δ | O | Δ | X | X | O | O | O | O |
| Overall judgement | | X | X | Δ | O | Δ | X | X | ⊙ | ⊙ | ⊙ | O |

| | | No. 24 | 25 | 26 | 27 | 28 | 29 | 30 | 31 | 32 | 33 | 34 | 35 |
|---|---|---|---|---|---|---|---|---|---|---|---|---|---|
| Composition (wt %) | $La_2O_3$ | 45 | 5 | 5 | 5 | 5 | 5 | 5 | 5 | 5 | — | — | — |
| | MgO | 20 | 40 | 40 | 40 | 40 | 40 | 40 | 40 | 40 | 40 | 18.5 | 32 |
| | CaO | 3 | 3 | 3 | 3 | 3 | 3 | 3 | 3 | 3 | — | 26 | — |
| | BaO | — | 16 | 25 | 13 | 11 | 11 | 11 | 11 | 10 | 18 | — | 29.2 |
| | $B_2O_3$ | 20 | 24 | 18 | 23 | 28 | 28 | 28 | 27 | 28 | 22 | 12.4 | 13.3 |
| | $SiO_2$ | 10 | 12 | 9 | 11 | 10 | 10 | 10 | 9 | 10 | 18 | 33.2 | 24.3 |
| | $ZrO_2$ | 2 | — | — | 5 | 2 | 2 | — | — | 2 | — | — | — |
| | $TiO_2$ | — | — | — | — | 1 | — | — | — | — | — | — | — |
| | $SnO_2$ | — | — | — | — | — | 1 | — | — | — | — | — | — |
| | $P_2O_5$ | — | — | — | — | — | — | 3 | 5 | — | 2 | — | 1.1 |
| | $Al_2O_3$ | — | — | — | — | — | — | — | — | 2 | — | 3.6 | — |
| | ZnO | — | — | — | — | — | — | — | — | — | — | 6.3 | — |
| $SiO_2/B_2O_3$ | | 0.5 | 0.5 | 0.5 | 0.48 | 0.36 | 0.36 | 0.36 | 0.33 | 0.36 | 0.82 | 2.68 | 1.83 |
| Surface roughness | | 0.13 | 0.08 | 0.09 | 0.07 | 0.06 | 0.05 | 0.05 | 0.07 | 0.06 | 0.18 | 0.29 | 0.25 |

TABLE 1-continued

| | | | | | | | | | | | |
|---|---|---|---|---|---|---|---|---|---|---|---|
| Waviness (μm) | 1.2 | 0.8 | 0.8 | 0.6 | 0.5 | 0.5 | 0.6 | 0.6 | 0.7 | 1.7 | 3.9 | 2.7 |
| Thermal resistance | Δ | ○ | ○ | ○ | ○ | ○ | ○ | ○ | ○ | Δ | ○ | ○ |
| Acid durability | Δ | X | X | ◉ | ○ | ○ | ○ | ○ | ○ | X | ○ | ○ |
| Printing accuracy | Δ | X | X | ○ | ○ | ○ | ○ | ○ | ○ | X | X | X |
| Overall judgement | X | X | X | ◉ | ○ | ○ | ○ | ○ | ○ | X | X | X |

TABLE 2

| | | No. | | | | | |
|---|---|---|---|---|---|---|---|
| | | 36 | 37 | 38 | 39 | 40 | 41 |
| Composition (wt %) | La$_2$O$_3$ | 5 | 5 | 5 | 5 | 5 | — |
| | MgO | 38 | 38 | 38 | 38 | 38 | 40 |
| | CaO | 18 | 12 | 6 | 3 | — | 18 |
| | BaO | — | 6 | 12 | 15 | 18 | — |
| | B$_2$O$_3$ | 22 | 22 | 22 | 22 | 22 | 23 |
| | SiO$_2$ | 14 | 14 | 14 | 14 | 14 | 15 |
| | ZrO$_2$ | 2 | 2 | 2 | 2 | 2 | 3 |
| | P$_2$O$_5$ | 1 | 1 | 1 | 1 | 1 | 1 |
| BaO/(BaO + CaO) | | 0.0 | 0.33 | 0.67 | 0.83 | 1.0 | 0.0 |

TABLE 3

| | | No. | | | | | | | | | |
|---|---|---|---|---|---|---|---|---|---|---|---|
| | | 42 | 43 | 44 | 45 | 46 | 47 | 48 | 49 | 50 | 51 |
| Composition (wt %) | CeO$_2$ | 28.6 | 16.7 | 9.1 | 33.3 | 4.8 | 4.8 | 9.1 | 16.7 | 28.6 | 33.3 |
| | MgO | 28.6 | 33.3 | 36.4 | 26.7 | 38.1 | 38.1 | 36.4 | 33.3 | 28.6 | 26.7 |
| | CaO | 2.1 | 2.5 | 2.7 | 2 | 2.9 | 17.1 | 16.4 | 15 | 12.8 | 12 |
| | BaO | 10.7 | 12.5 | 13.6 | 10 | 14.3 | — | — | — | — | — |
| | B$_2$O$_3$ | 16.4 | 19.2 | 20.9 | 15.3 | 21.9 | 21.9 | 20.9 | 19.2 | 16.4 | 15.3 |
| | SiO$_2$ | 10.7 | 12.5 | 13.6 | 10 | 14.3 | 14.3 | 13.6 | 12.5 | 10.7 | 10 |
| | ZrO$_2$ | 2.1 | 2.5 | 2.7 | 2 | 2.9 | 2.9 | 2.7 | 2.5 | 2.1 | 2 |
| | TiO$_2$ | — | — | — | — | — | — | — | — | — | — |
| | SnO$_2$ | — | — | — | — | — | — | — | — | — | — |
| | P$_2$O$_5$ | 0.7 | 0.8 | 0.9 | 0.7 | 0.9 | 0.9 | 0.9 | 0.8 | 0.7 | 0.7 |
| SiO$_2$/B$_2$O$_3$ | | 0.65 | 0.65 | 0.65 | 0.65 | 0.65 | 0.65 | 0.65 | 0.65 | 0.65 | 0.65 |
| Surface roughness (μm) | | 0.13 | 0.12 | 0.11 | 0.07 | 0.15 | 0.15 | 0.13 | 0.12 | 0.1 | 0.08 |
| Waviness (μm) | | 1.4 | 1.3 | 1.2 | 1.1 | 1.6 | 1.6 | 1.4 | 1.2 | 1.1 | 1.0 |
| Thermal resistance | | ○ | ○ | ○ | Δ | ○ | ○ | ○ | ○ | ○ | Δ |
| Acid durability | | Δ | Δ | ○ | ○ | Δ | ○ | ○ | ○ | ○ | ○ |
| Printing accuracy | | ○ | ○ | ○ | ○ | ○ | ○ | ○ | ○ | ○ | ○ |
| Overall judgement | | ○ | ○ | ◉ | ○ | ○ | ◉ | ◉ | ◉ | ◉ | ○ |

| | | No. | | | | | | | | |
|---|---|---|---|---|---|---|---|---|---|---|
| | | 52 | 53 | 54 | 55 | 56 | 57 | 58 | 59 | 60 |
| Composition (wt %) | CeO$_2$ | 4.8 | 4.8 | 4.8 | 4.8 | 4.8 | 4.8 | 4.8 | 4.8 | 4.7 |
| | MgO | 38.1 | 38.1 | 36.2 | 36.2 | 38.1 | 38.1 | 38.1 | 38.1 | 37.4 |
| | CaO | 17.1 | 2.9 | — | 2.9 | 2.9 | 2.9 | 17.1 | 2.9 | 16.8 |
| | BaO | — | 14.3 | 17.1 | 14.3 | 14.3 | 14.3 | — | 14.3 | — |
| | B$_2$O$_3$ | 18.1 | 18.1 | 21.9 | 21.9 | 21.9 | 21.9 | 24.8 | 24.8 | 21.5 |
| | SiO$_2$ | 18.1 | 18.1 | 16.2 | 16.2 | 14.3 | 14.3 | 11.4 | 11.4 | 14.0 |
| | ZrO$_2$ | 2.9 | 2.9 | 2.9 | 2.9 | — | — | 2.9 | 2.9 | 2.8 |
| | TiO$_2$ | — | — | — | — | 2.9 | — | — | — | — |
| | SnO$_2$ | — | — | — | — | — | 2.9 | — | — | — |
| | P$_2$O$_5$ | 0.9 | 0.9 | 0.9 | 0.9 | 0.9 | 0.9 | 0.9 | 0.9 | 2.8 |
| SiO$_2$/B$_2$O$_3$ | | 1.0 | 1.0 | 0.74 | 0.74 | 0.65 | 0.65 | 0.46 | 0.46 | 0.65 |
| Surface roughness (μm) | | 0.19 | 0.20 | 0.18 | 0.20 | 0.18 | 0.17 | 0.11 | 0.12 | 0.11 |
| Waviness (μm) | | 1.9 | 1.9 | 1.8 | 1.7 | 1.9 | 1.8 | 1.3 | 1.3 | 1.1 |
| Thermal resistance | | ○ | ○ | ○ | ○ | ○ | ○ | Δ | Δ | ○ |
| Acid durability | | ○ | ○ | Δ | ○ | ○ | ○ | Δ | Δ | Δ |
| Printing accuracy | | Δ | Δ | Δ | Δ | Δ | Δ | ○ | ○ | ○ |
| Overall judgement | | ○ | ○ | ○ | ○ | ○ | ○ | ○ | ○ | ○ |

What is claimed is:

1. A glass ceramic for coating metal substrates of which the principal components at least comprise 3-40% of La$_2$O$_3$ or CeO$_2$, 20-50% of MgO, 1-20% of CaO, 0-15% BaO, 10-30% of B$_2$O$_3$, 8-20% of SiO$_2$, 0-5% of MO$_2$, M being at least one metal selected from Zr, Ti and Sn, and 0-5% of P$_2$O$_5$, respectively in terms of % by weight.

2. A glass ceramic for coating metal substrates according to claim 1 which at least comprises 3-30% of La$_2$O$_3$ or CeO$_2$, 20-40% of MgO, 1-20% of CaO, 0-15% of BaO, 15-25% of B$_2$O$_3$, 10-20% of SiO$_2$, 0-5% of ZrO$_2$, and 0-5% of P$_2$O$_5$, respectively in terms of % by weight.

3. A glass ceramic for coating metal substrates according to claim 2 which at least comprises 3-30% of La$_2$O$_3$ or CeO$_2$, 20-40% of MgO, 1-20% of CaO, 15-25% of B$_2$O$_3$, 10-20% of SiO$_2$, 0-5% of ZrO$_2$, and 0-5% of P$_2$O$_5$, respectively in terms of % by weight.

* * * * *